United States Patent
Hwang et al.

(10) Patent No.: US 8,320,170 B2
(45) Date of Patent: Nov. 27, 2012

(54) MULTI-BIT PHASE CHANGE MEMORY DEVICES

(75) Inventors: Young-nam Hwang, Hwaseong-si (KR);
Soon-oh Park, Suwon-si (KR);
Hong-sik Jeong, Seongnam-si (KR);
Gi-tae Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 375 days.

(21) Appl. No.: 12/656,716

(22) Filed: Feb. 16, 2010

(65) Prior Publication Data

US 2010/0220520 A1 Sep. 2, 2010

(30) Foreign Application Priority Data

Feb. 27, 2009 (KR) .................. 10-2009-0017154

(51) Int. Cl.
*G11C 11/00* (2006.01)
(52) U.S. Cl. ............... 365/163; 365/148; 257/4
(58) Field of Classification Search ............ 365/148, 365/163; 257/4
See application file for complete search history.

(56) References Cited

U.S. PATENT DOCUMENTS

| 7,227,170 | B2 | 6/2007 | Ovshinsky | |
|---|---|---|---|---|
| 2007/0170881 | A1* | 7/2007 | Noh et al. | 318/453 |
| 2009/0021977 | A1* | 1/2009 | Kang et al. | 365/163 |
| 2009/0244962 | A1* | 10/2009 | Gordon et al. | 365/163 |

FOREIGN PATENT DOCUMENTS

| KR | 10-2006-0099158 | 9/2006 |
|---|---|---|
| KR | 10-0651657 | 12/2006 |
| KR | 10-2008-0056454 | 6/2008 |

* cited by examiner

*Primary Examiner* — Ly D Pham
(74) *Attorney, Agent, or Firm* — Harness, Dickey & Pierce, P.L.C.

(57) ABSTRACT

A multi-bit phase change memory device including a phase change material having a plurality of crystalline phases. A non-volatile multi-bit phase change memory device may include a phase change material in a storage node, wherein the phase change material includes a binary or ternary compound sequentially having at least three crystalline phases having different resistance values according to an increase of temperature of the phase change material.

16 Claims, 7 Drawing Sheets

MULTI-BIT PHASE CHANGE MEMORY DEVICES

CROSS-REFERENCE TO RELATED APPLICATIONS

This application claims priority under 35 U.S.C. §119 to Korean Patent Application No. 10-2009-0017154, filed on Feb. 27, 2009, in the Korean Intellectual Property Office (KIPO), the entire contents of which is incorporated herein by reference.

BACKGROUND

Example embodiments of the inventive concepts relate to non-volatile semiconductor memory technology, and more particularly, to multi-bit phase change memory devices including phase change materials having a plurality of crystalline phases.

Recently, as demand for portable digital application devices (e.g., digital cameras, MP3 players, personal digital assistants (PDAs), and mobile phones) increases, the non-volatile memory market is rapidly expanding. In general, flash memory devices are widely used as non-volatile memory devices. However, flash memory devices include memory cells in the form of metal-oxide-semiconductor (MOS) transistors as basic components and may be reaching technological and/or market limitations in view of continuous demands for high integration and cost reduction.

In order to replace flash memory devices, phase change memory devices have been attracting increasing attention due to excellent and/or improved 10 year data retaining performance, as well as high-speed random reading and writing performance. Phase change memory devices may have read speeds of about 50 ns and write speeds of about 100 ns, as in dynamic random access memory (DRAM) devices. Unlike flash memory devices, phase change memory devices may have directly programmed memory cells without erasing and writing an entire data block.

A phase change memory device may include a phase change material that is reversibly switchable between a crystalline phase (e.g., a set phase) and an amorphous phase (e.g., a reset phase). A phase change memory device may record data by using a difference of resistance values between the set and reset phases. Currently, a germanium (Ge)-antimony (Sb)-tellurium (Te)-based material, a chalcogen compound, and more particularly, a composition following a pseudo-binary tie line of $GeTe$—$Sb_2Te_3$ (e.g., $Ge_2Sb_2Te_5$) is primarily being investigated as a phase change material.

A Ge—Sb—Te-based material may be appropriate for a phase change memory device due to its fast and stable phase change and excellent oxidation-resistance. Nevertheless, the Ge—Sb—Te-based material may have only two resistance values corresponding to set and reset phases and thus may have only a 1-bit data storage density in each unit cell. In order to increase the recording density of a non-volatile memory device using a phase change material, a new material having a 2 or more-bit data storage density in each unit cell may be required.

SUMMARY

Example embodiments of the inventive concepts provide a multi-bit phase change memory device including a phase change material with improved and/or increased data storage density.

Example embodiments of the inventive concepts provide a multi-bit recordable non-volatile memory device using a phase change material having at least three crystalline phases having different resistance values according to the increase of temperature in order to improve and/or increase the data storage density of the non-volatile memory device.

According to example embodiments of the inventive concepts, there is provided a multi-bit phase change memory device that is a non-volatile memory device comprising a phase change material in a storage node, wherein the phase change material comprises a binary or ternary compound sequentially having at least three crystalline phases having different resistance values according to the increase of temperature as a base material.

According to example embodiments of the inventive concepts, there is provided a multi-bit phase change memory device including a phase change material having at least one of a binary and ternary compound, the at least one compound configured to switch between at least three different crystalline states.

At least one of a eutectoid reaction and a peritectic reaction may occur to the base material according to the increase of temperature. The base material may include a chalcogen compound represented by Chemical Formula 1: $M_a(In_xTe_{1-x})_b$. In Chemical Formula 1, M may be at least one element selected from the group consisting of silver (Ag), germanium (Ge), bismuth (Bi), antimony (Sb), and silicon (Si), x may satisfy $0.35 \leq x \leq 0.65$, and a and b may satisfy $a+b=1$. Also, in Chemical Formula 1, a may satisfy $0 < a \leq 0.3$. The phase change material may include at least one selected from the group consisting of carbon (C), nitrogen (N) and oxygen (O) in order to adjust at least one of a crystallization temperature and a melting temperature of the base material. The base material may include a chalcogen compound represented by Chemical Formula 2: $A_aM_b(In_xTe_{1-x})_b$. In Chemical Formula 2, A may be at least one element selected from the group consisting of carbon (C), nitrogen (N) and oxygen (O), M may be at least one element selected from the group consisting of silver (Ag), germanium (Ge), bismuth (Bi), antimony (Sb), and silicon (Si), x may satisfy $0.4 \leq x \leq 0.6$, a, b, and c satisfy $a+b+c=1$, and a and b may satisfy $0 < a \leq 0.1$ and $0 < b \leq 0.3$.

Data may be recorded in a reset phase by providing electrical energy in the form of a pulse to the phase change material, and heating, melting, and then cooling at least a portion of the phase change material so as to have an amorphous structure, or is recorded in a set phase by heating at least a portion of the phase change material so as to have one of the at least three crystalline phases. The recorded data may be identified by using differences of resistance values between the amorphous structure and the at least crystalline structures. The storage node may further include first and second electrode layers contacting the phase change material and providing current through the phase change material, and at least one of the first and second electrode layers is coupled with a word line and the other of the first and second electrode layers is coupled with a bit line.

According to example embodiments of the inventive concepts, there is provided a non-volatile memory device including a first electrode layer, a phase change material layer on the first electrode layer, the phase change material layer configured to switch between at least 4 resistance states, the resistance states including an InSb crystal state, an In3Sb1Te2 crystal state, an InTe crystal state and an amorphous state, a heating member on the phase change material layer, and a second electrode on the heating member.

According to example embodiments of the inventive concepts, there is provided a phase change material layer including a ternary compound having pseudo-binary behavior characteristics, the ternary compound configured to reversibly change between a plurality of different crystalline phases and at least one amorphous phase, the phase of the ternary compound determined according to applied energy.

BRIEF DESCRIPTION OF THE DRAWINGS

Example embodiments of the inventive concepts will be more clearly understood from the following brief description taken in conjunction with the accompanying drawings. FIGS. 1-11 represent non-limiting, example embodiments as described herein.

FIG. 1 is a cross-sectional diagram of a storage node of a multi-bit phase change memory device according to example embodiments of the inventive concepts;

FIG. 2 is an equivalent circuit diagram of effective resistance components of the storage node illustrated in FIG. 1;

FIG. 3 is a graph illustrating methods of operating multi-bit phase change memory devices according to example embodiments of the inventive concepts;

FIG. 4 is a phase equilibrium diagram of $Sb_a(In_xTe_{1-x})_b$ included in a storage node of a multi-bit phase change memory device according to example embodiments of the inventive concept;

FIG. 5 is a graph of heat flux (MW) as a function of temperature (° C.) illustrating a result of a differential scanning calorimetry (DSC) analysis of $Sb_a(In_xTe_{1-x})_b$ according to example embodiments of the inventive concepts;

FIG. 6 is a graph illustrating a result of a high-temperature X-ray diffraction analysis of $Sb_a(In_xTe_{1-x})_b$ according to example embodiments of the inventive concepts;

FIG. 7 is a graph illustrating activation energy required to crystallize $Sb_a(In_xTe_{1-x})_b$ according to a Kissinger method;

FIG. 9 is a graph of resistance (Ω) as a function of cycles (e.g., cycling endurance) for a reversible phase change between an amorphous phase (reset phase) and an indium antimonide (InSb) crystalline phase (set phase) of a phase change memory cell according to example embodiments of the inventive concepts;

FIG. 10 is a schematic diagram roughly illustrating a memory card 500 according to example embodiments; and FIG. 11 is a block diagram roughly illustrating an electronic system 600 according to example embodiments.

Figure 1:
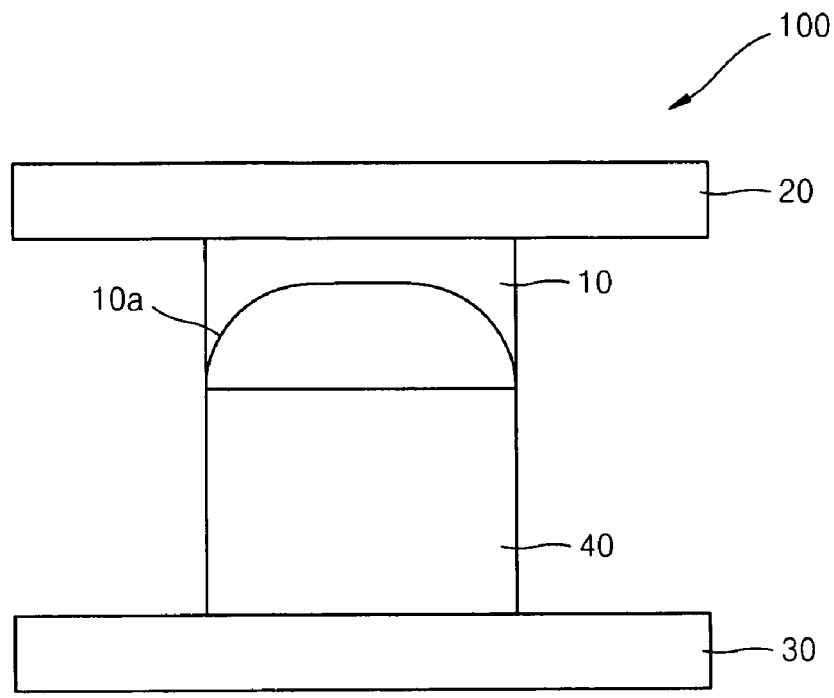

It should be noted that these Figures are intended to illustrate the general characteristics of methods, structure and/or materials utilized in certain example embodiments of the inventive concepts and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

In the following descriptions, a "substrate" may be a general substrate having any adaptable surface on which a material is deposited or applied. A substrate may include a semiconductor substrate such as a silicon (Si) wafer. Other examples include, without limitation, a substrate may be substantially fabricated by using, for example, metal, Si, germanium (Ge), plastic, glass, a material such as a Si compound (including, e.g., a low-k Si—O—C—H film) and/or a Si alloy. Example embodiments of the inventive concepts may include substrates including any suitable material. A substrate may have a physical structure such as trenches or steps therein as in a partially fabricated integrated circuit.

Figure 2:
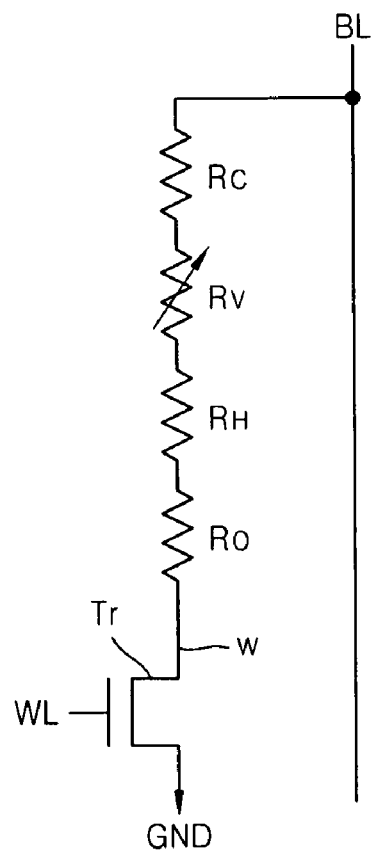

FIG. 1 is a cross-sectional diagram of a storage node 100 of a multi-bit phase change memory device according to example embodiments of the inventive concepts. FIG. 2 is an equivalent circuit diagram of effective resistance components of the storage node 100 illustrated in FIG. 1. Referring to FIG. 1, the storage node 100 may include a phase change material 10, an upper electrode 20 and a lower electrode 30. Upper electrode 20 and lower electrode 30 may provide current through the phase change material 10. The storage node 100 may further include a heating member 40 between the lower electrode 30 and the phase change material 10. The heating member 40 may apply heat to the phase change material 10.

Referring to FIGS. 1 and 2, the storage node 100 illustrated in FIG. 1 may have serially-connected resistance components $R_O+R_H+R_V+R_C$ between a bit line BL and a ground terminal GND. The resistance component $R_O$ may represent a contact resistance between a wire w and the upper and lower electrodes 20 and 30. The resistance component $R_H$ may represent a resistance of the heating member 40. The heating member 40 may be a heat source for providing electrical energy of current$\times R_H^2$ to the phase change material 10. The resistance component $R_C$ may represent a static resistance having a resistance value of a set phase of the phase change material 10. The current flowing through the storage node 100 may be controlled by a switching member. For example, the storage node 100 may be controlled by a transistor Tr which is connected to a word line WL. Upon supplying a current to the storage node 100 through the bit line BL, at least a portion 10a of the phase change material 10 may be phase-changed. The resistance component $R_V$ may represent the variable resistance values of set and reset phases corresponding to recording data of the storage node 100 and may be detected through the bit line BL.

According to example embodiments, the phase change material 10 may have three crystalline structures according to increases of temperature and the crystalline structures have different resistance values. For example, the resistance component $R_C$ may have three different resistance values of the resistance component $R_V$. The variable resistance component $R_V$ may have a value 0 and three resistance values corresponding to the differences between the values of the set and reset phases. For example, four different resistance values of the variable resistor $R_V$ may be read, corresponding to data states (00), (01), (10), and (11). Accordingly, the storage node 100 may be realized by, for example, a two-bit recording density in each unit cell.

Figure 3:
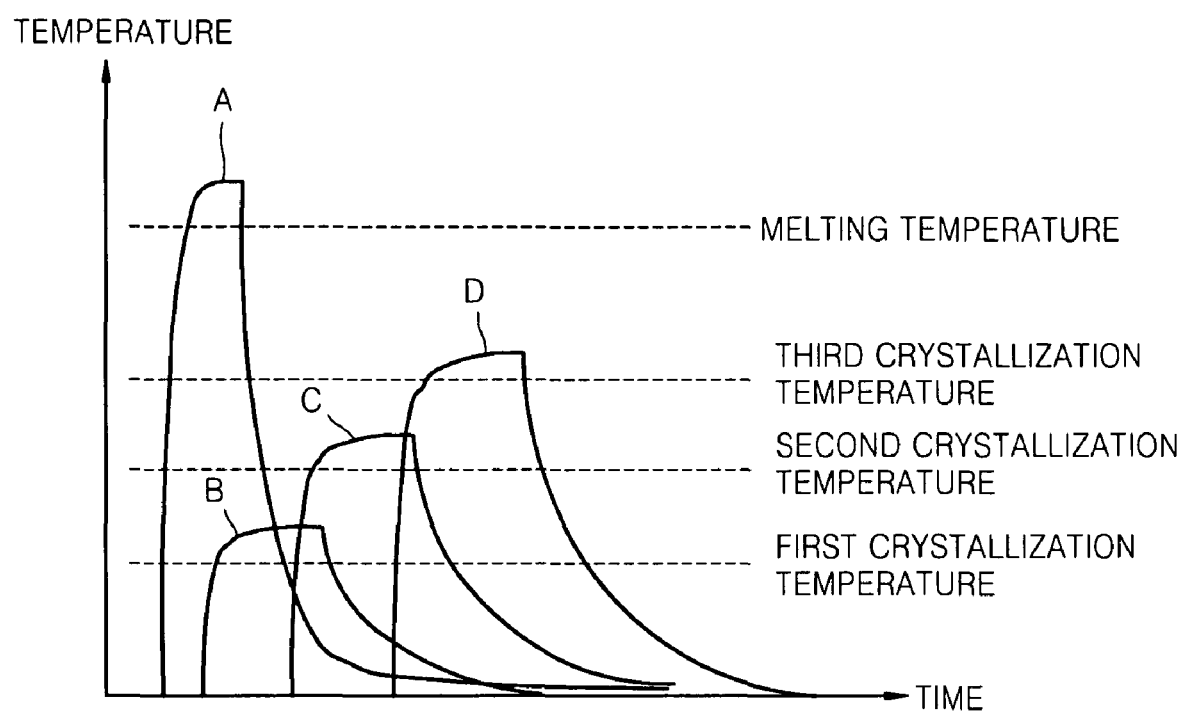

FIG. 3 is a graph illustrating methods of operating multi-bit phase change memory devices according to example embodiments of the inventive concepts. Referring to FIG. 3, the horizontal axis may represent application time of a pulse (e.g., a pulse-type electrical energy) applied to the phase change material 10 illustrated in FIG. 1. A vertical axis may represent temperature of the phase change material 10 heated due to the electrical energy.

As may be indicated by curve A, if a current pulse is applied to heat the phase change material 10 to a temperature above a melting temperature and the current pulse is reduced so that the phase change material 10 is cooled faster than a crystallization speed of the phase change material 10, the phase change material 10 may have an amorphous structure. As may be indicated by curve B, if a current pulse is applied to heat the phase change material 10 to a temperature above a first crystallization temperature, nucleation may occur and crystallization may be initiated. If the current pulse is applied until crystallization is completed, and the current pulse is reduced, the phase change material 10 may have a first crystalline structure. As may be indicated by curves C and D, if current pulses are applied to heat the phase change material 10 respectively to above second and third crystallization temperatures and corresponding crystallizations are completed, the phase change material 10 may have second and third crystalline structures, respectively.

The above-described methods are examples only and example embodiments of the inventive concepts are not limited thereto. For example, a set sweep method for crystallization of the phase change material 10 may be used. For example, in the graph of FIG. 3, a leading edge of a current pulse may be increased to above the melting temperature (e.g., equal to height of a reset pulse) and the current pulse may be gradually reduced to about a first, second or third crystallization temperature. Each of the first through third crystalline states may be obtained by stopping the current pulse when crystallization is completed at a corresponding one of the first through third crystallization temperatures.

Figure 4:
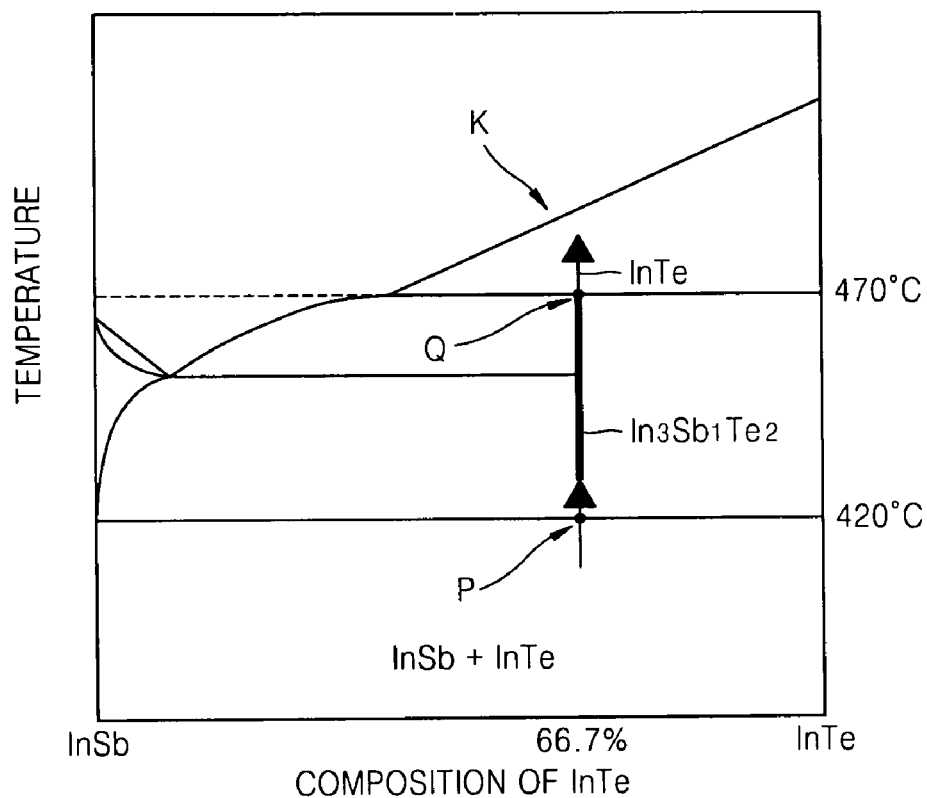

FIG. 4 is a phase equilibrium diagram of Sba(InxTe1-x)b included in a storage node of a multi-bit phase change memory device according to example embodiments of the inventive concept. $Sb_a(In_xTe_{1-x})_b$ may be included in a phase change material used in a storage node of a multi-bit phase change memory device. Referring to FIG. 4, $Sb_a(In_xTe_{1-x})_b$ is a ternary compound having pseudo-binary behavior characteristics of indium antimonide (InSb) and indium telluride (InTe). Phase change of a composition including about 66.6 mole % (e.g., at and near about 66.6 mole %) of InTe, represented by a chemical formula $In_3Sb_1Te_2$ (a=1, b=5, and x=⅗) in a tie line of InSb—InTe, may be considered. Hereinafter, all compositions of the phase change material are represented by mole %.

InTe and InSb phases may exist in a mixture phase of two phases at a temperature lower than about 420° C. A eutectoid reaction represented by Formula 1 (below) may occur at about 420° C. illustrated as point P in FIG. 4. Because of the eutectoid reaction, one stoichiometric $In_3Sb_1Te_2$ crystalline phase may be generated from two InTe and InSb crystalline phases (see FIG. 6 at 400° C. and 450° C.). In Formula 1, S may represent a solid phase.

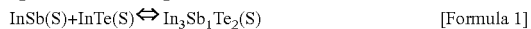

InSb(S)+InTe(S)⇔$In_3Sb_1Te_2$(S)  [Formula 1]

At a temperature of about 470° C., illustrated as point Q in FIG. 4, a peritectic reaction represented by Formula 2 may occur. Because of the peritectic reaction, an InTe crystalline phase may be obtained from the $In_3Sb_1Te_2$ crystalline phase. In Formula 2, L may represent a liquid phase.

$In_3Sb_1Te_2$(S)⇔InTe(S)+L  [Formula 2]

At a temperature above about 620° C., across a liquidus line K, and InTe(S) may be completely melted so that only a liquid phase exists. Amorphous InTe may be obtained by rapidly cooling InTe(L).

As described above, intermediate crystalline phases of $In_3Sb_1Te_2$(S) and InTe(S) may sequentially occur from a mixture of InSb(S) and InTe(S) in a composition including about 66.6 mole % of InTe in a tie line of InSb—InTe of $Sb_a(In_xTe_{1-x})_b$, as temperature is increased.

Figure 5:
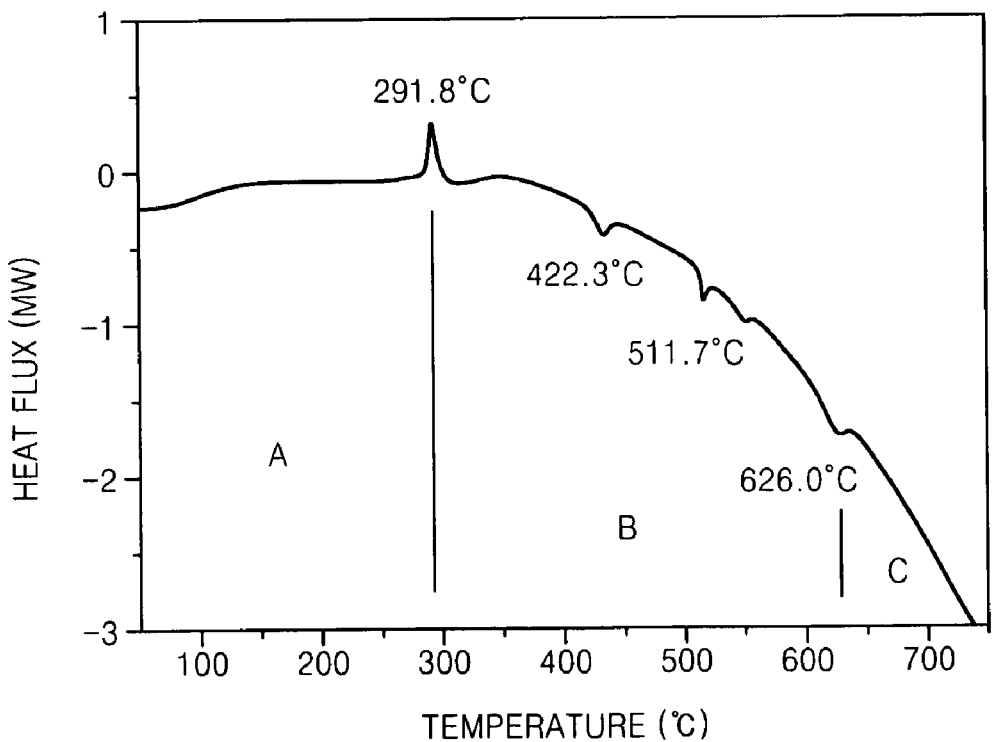

FIG. 5 is a graph of heat flux (MW) as a function of temperature (° C.) illustrating a result of a differential scanning calorimetry (DSC) analysis of $Sb_a(In_xTe_{1-x})_b$ including about 66.6 mole % of InTe according to example embodiments of the inventive concepts. A sample of the phase change material, which may be prepared by using a radio frequency (RF) magnetron sputtering process with a target having a composition of $In_3Sb_1Te_2$, may be subjected to DSC analysis. The sample may have a thickness of about 200 nm. The DSC analysis may be performed in a range between about room temperature and about 700° C. by maintaining a heating rate of about 10° C./min. In FIG. 5, a horizontal axis may represent a heating temperature (° C.) and a vertical axis may represent a heat flux (mW).

Referring to FIG. 5, one exothermic peak and three endothermic peaks may be observed in the range between about room temperature and about 700° C. An exothermic peak at about 291.8° C. and an endothermic peak at about 626.0° C. may respectively correspond to a crystallization temperature and a melting temperature of the sample of the phase change material. The sample of the phase change material may be amorphous below about 291.8° C. in the region A and may be crystalline between about 291.8° C. and about 626.0° C. in the region B. The sample of the phase change material may be melted at above about 626.0° C. in the region C and may be amorphous when rapidly cooled. In the region B between about 291.8° C. and about 626.0° C., where the sample of the phase change material is crystalline, two endothermic peaks may be observed at about 422.3° C. and about 511.7° C. A high-temperature X-ray diffraction analysis may be performed to analyze the crystallinity in the region B, and a result thereof is illustrated in FIG. 6.

Figure 6:
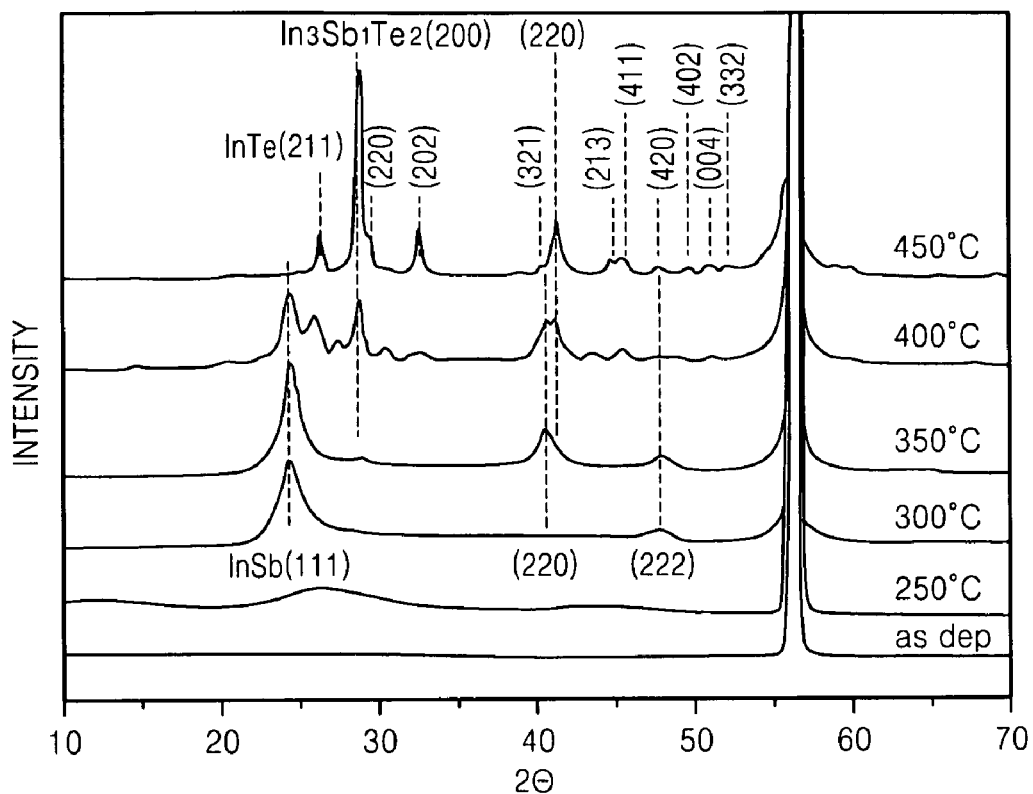

FIG. 6 is a graph illustrating a result of a high-temperature X-ray diffraction analysis of Sba(InxTe1-x)b according to example embodiments of the inventive concepts. Crystal orientations may be illustrated in parentheses. Referring to FIG. 6, no crystallinity may be observed from an as-deposited (as dep) sample of the phase change material (e.g., not thermally treated). A sample of the phase change material thermally treated at about 250° C. may not show any crystallinity. A crystalline phase of InSb may be observed from the sample of the phase change material which is thermally treated at about 300° C., which may correlate to an exothermic peak occurring at about 291.8° C. as illustrated in FIG. 5. A crystalline phase of InTe may not be observed at about 300° C. Only the crystalline phase of InSb may be observed and the crystalline phase of InTe may not be observed at about 350° C. and about 400° C. When compared to the phase equilibrium diagram of FIG. 4, in consideration that a crystalline InTe phase may not occur at below about 425° C., the sample of the phase change material according to the current embodiment may have a non-equilibrium phase transformation behavior.

As described above with reference to FIG. 4, crystalline phases of $In_3Sb_1Te_2$ and InTe may be observed from the sample of the phase change material which is thermally treated at about 450° C., higher than about 420° C. at which a eutectoid reaction occurs. Although not shown in FIG. 6, if the annealing temperature is increased to about 511.7° C. an endothermic peak may occur. The crystalline phase of $In_3Sb_1Te_2$ may disappear and only the crystalline phase of InTe may remain, corresponding to a peritectic reaction at about 470° C. as described above with reference to FIG. 3.

$Sb_a(In_xTe_{1-x})_b$ according to example embodiments of the inventive concepts in an amorphous phase may exhibit sequential crystalline phases of InSb, $In_3Sb_1Te_2$, and InTe as temperature is increased. $Ge_2Sb_2Te_5$, a conventional phase change material, may have a crystallization temperature of about 130° C. and a melting temperature of about 630° C. The DSC analysis result of $Sb_a(In_xTe_{1-x})_b$ may verify that the crystallization temperature and the melting temperature of the phase change material according to example embodiments may be about 291° C. and about 626° C., respectively. $Sb_a(In_xTe_{1-x})_b$ may have a higher crystallization temperature than $Ge_2Sb_2Te_5$ and may be expected to have a higher and/or increased resistance against thermal interference between cells.

Although $In_3Sb_1Te_2$ is described above as an example of $Sb_a(In_xTe_{1-x})_b$, other compounds are included in example embodiments of the inventive concepts. For example, a compound in a composition region where x satisfies $0.35 \leq x \leq 0.65$, and/or a and b satisfy a+b=1 (e.g., in consideration of stoichiometry) so as to sequentially form crystalline phases of InSb, $In_3Sb_1Te_2$, and InTe may also be used as a base material for a phase change material. For example, a compound in a composition region where x satisfies $0.35 \leq x \leq 0.65$, and/or a and b satisfy a+b=1 and $0 < a \leq 0.3$.

According to example embodiments of the inventive concepts, at least one selected from the group consisting of Ag, Ge, Bi, and Si (e.g., that are similar to antimony) or a combination thereof may be used, instead of or together with Sb in $Sb_a(In_xTe_{1-x})_b$ as the base material for the phase change material. At least one selected from the group consisting of carbon (C), nitrogen (N) and oxygen (O) may be added as impurities in order to adjust at least one of a crystallization temperature and a melting temperature of the phase change material. The base material for the phase change material may be represented as $A_aM_b(In_xTe_{1-x})_b$. A may be at least one element selected from the group consisting of C, N, and O. M may be at least one element selected from the group consisting of Ag, Ge, Bi, Sb, and Si. According to example embodiments, x may satisfy $0.4 \leq x \leq 0.6$, a, b, and/or c may satisfy $a+b+c=1$ in consideration of stoichiometry, and a and b may respectively satisfy $0 < a \leq 0.1$ and $0 < b \leq 0.3$.

Figure 7:
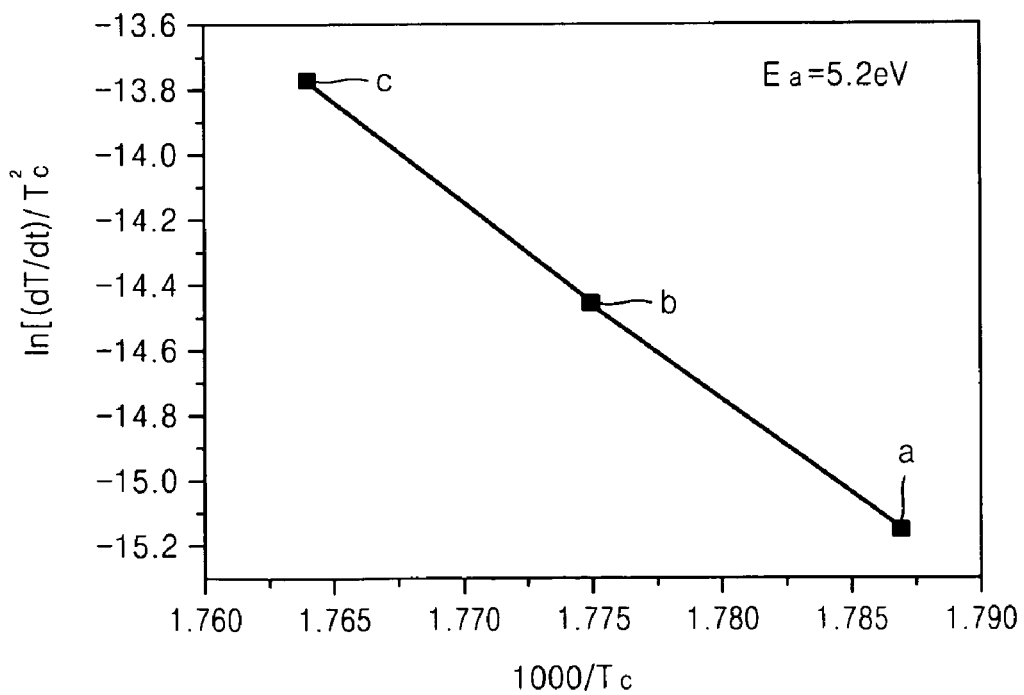

FIG. 7 is a graph illustrating activation energy Ea required to crystallize $Sb_a(In_xTe_{1-x})_b$ by using a Kissinger method. Referring to FIG. 7, the activation energy Ea may be measured when a heating rate is about 5° C./min (a), about 10° C./min (b) or about 20° C./min (c). According to the graph of FIG. 7, the activation energy Ea of $Sb_a(In_xTe_{1-x})_b$ is about 5.2 eV. In consideration that the activation energy required to crystallize conventional $Ge_2Sb_2Te_5$ into a NaCl type crystalline structure in a metastable phase is about 2.24 eV, the activation energy of $Sb_a(In_xTe_{1-x})_b$ may be larger. According to example embodiments of the inventive concepts, data retaining characteristics of a non-volatile memory are expected to improve and/or increase.

Figure 8A:
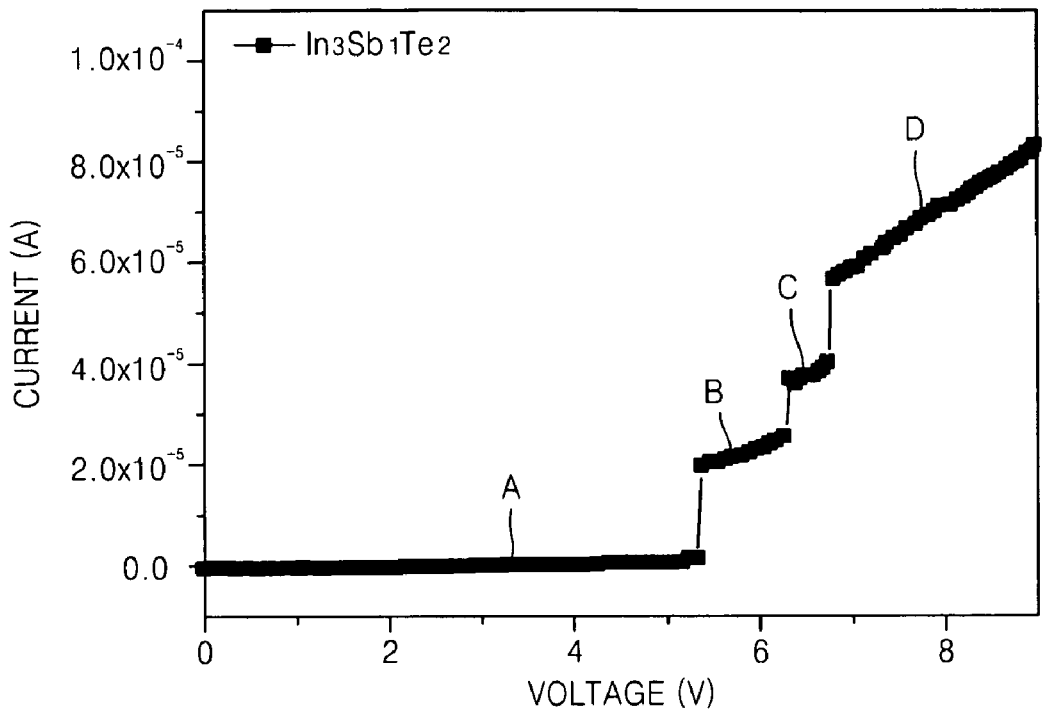
FIG. 8A is a graph illustrating current (A) as a function of voltage (V) for a non-volatile memory cell including $Sb_a(In_xTe_{1-x})_b$ according to example embodiments of the inventive concepts.
Figure 8B:
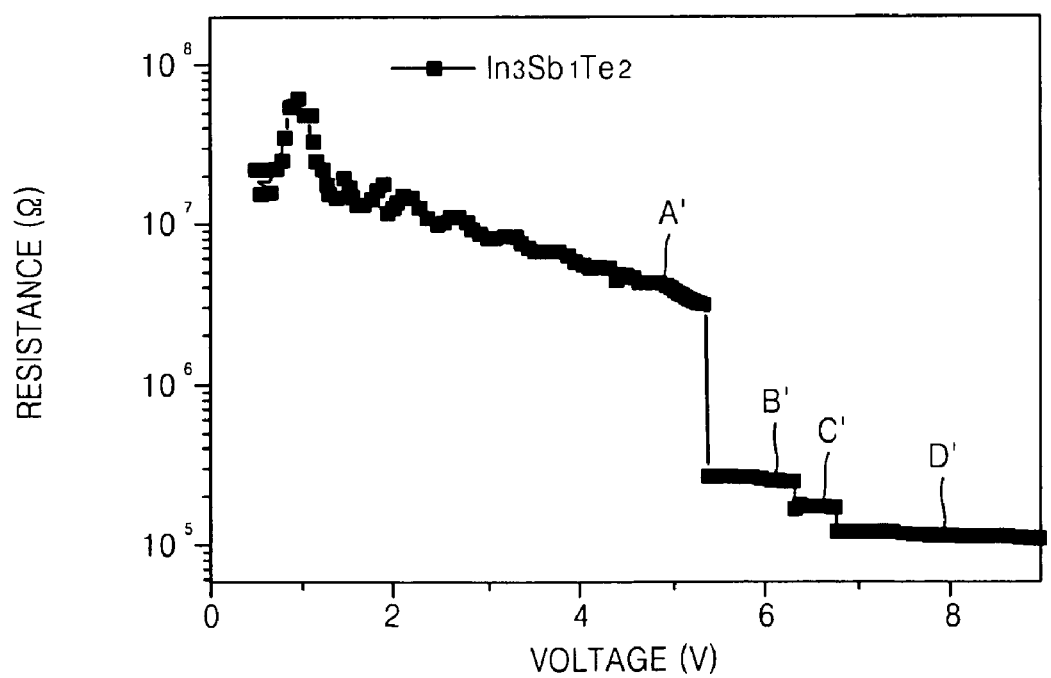
FIG. 8B is a graph illustrating resistance (Ω) as a function of voltage (V) for a non-volatile memory cell including $Sb_a(In_xTe_{1-x})_b$ according to example embodiments of the inventive concepts.

FIG. 8A is a graph illustrating current (A) as a function of voltage (V) for a non-volatile memory cell including $Sb_a(In_xTe_{1-x})_b$ according to example embodiments of the inventive concepts. FIG. 8B is a graph illustrating resistance (Ω) as a function of voltage (V) for a non-volatile memory cell including $Sb_a(In_xTe_{1-x})_b$ according to example embodiments of the inventive concepts. The non-volatile memory cell may have the structure illustrated in FIG. 1 and the composition of the phase change material may be $In_3Sb_1Te_2$.

Referring to FIG. 8A, it may be observed that a current flow is increased at about 5.36 V, about 6.31 V and about 6.76 V. Phases of the phase change material in continuous current periods A, B, C, and D may correspond to a mixture of crystalline InSb and amorphous InTe (D), crystalline $In_3Sb_1Te_2$ (C), amorphous InSb and crystalline InTe (B), and amorphous InSb and amorphous InTe (A) according to a crystallization order as temperature is increased. Referring to FIG. 8B, it may be verified that $In_3Sb_1Te_2$ according to the current embodiment may have three crystalline phases so as to have different four resistance values N, B', C', and D'. If the four different resistance values are read and correspond to data states of (00), (01), (10) and (11), a non-volatile memory device may be realized with a storage node having a two-bit recording density in every unit cell.

Figure 9:
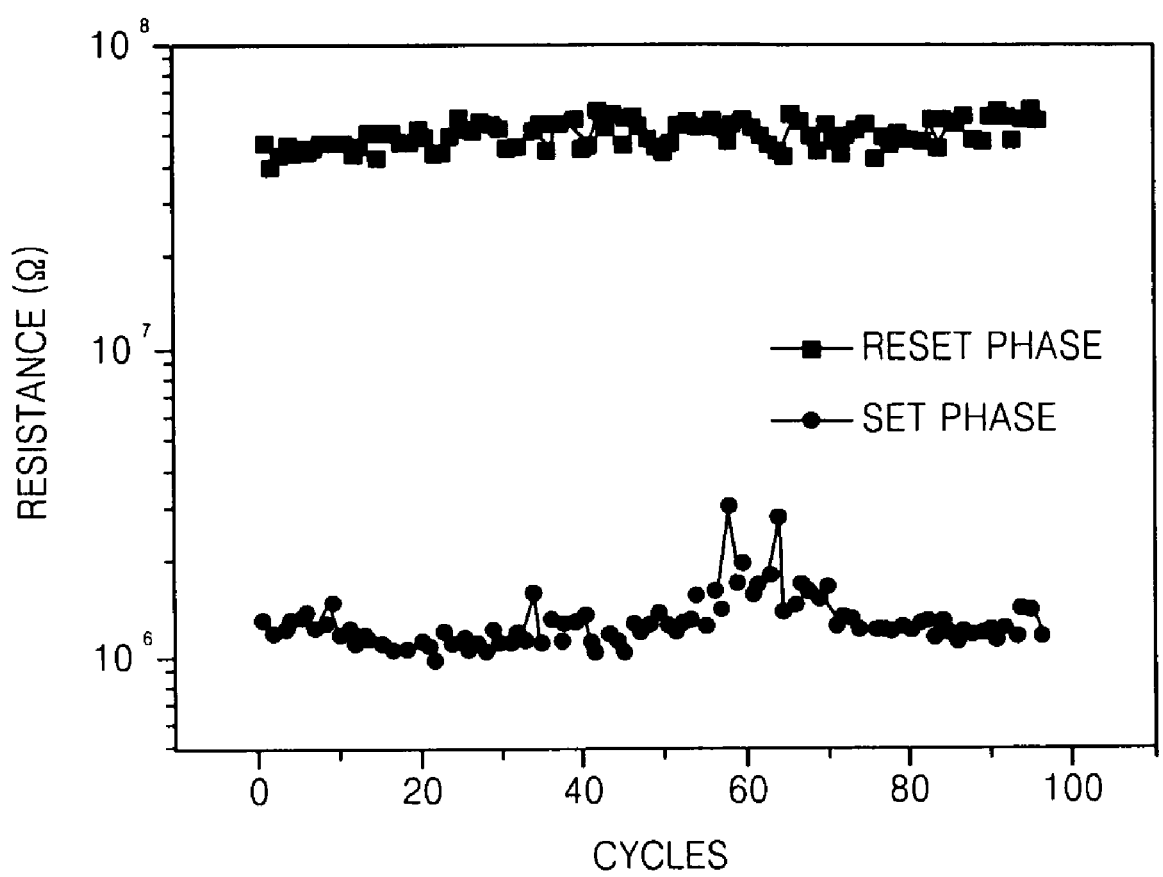

FIG. 9 is a graph of resistance (Ω) as a function of cycles (e.g., cycling endurance) for a reversible phase change between an amorphous phase (reset phase) and an indium antimonide (InSb) crystalline phase (set phase) (e.g., a low-temperature crystalline phase) of a phase change memory cell according to example embodiments of the inventive concepts. Referring to FIG. 9, as a result of repeating conversion between the set and reset phases by a pulse with 100 cycles, it may be observed that a phase change device using $In_3Sb_1Te_2$ may operate normally and a resistance ratio between the set and reset phases may be about 70. Although not shown in FIG. 9, referring to FIGS. 8A and 8B, resistance ratios of an $In_3Sb_1Te_2$ crystalline phase and an InTe crystalline phase with respect to the amorphous phase may be greater than about 70. $Sb_a(In_xTe_{1-x})_b$ may be a candidate material for a multi-bit drivable phase change memory device.

Although $Sb_a(In_xTe_{1-x})_b$ (e.g., a ternary compound) is described hereinabove, it will be understood by one of ordinary skill in the art that a binary compound having at least three crystalline phases sequentially having different resistance values according to the increase of temperature may also be included in the scope of the inventive concept.

Figure 10:
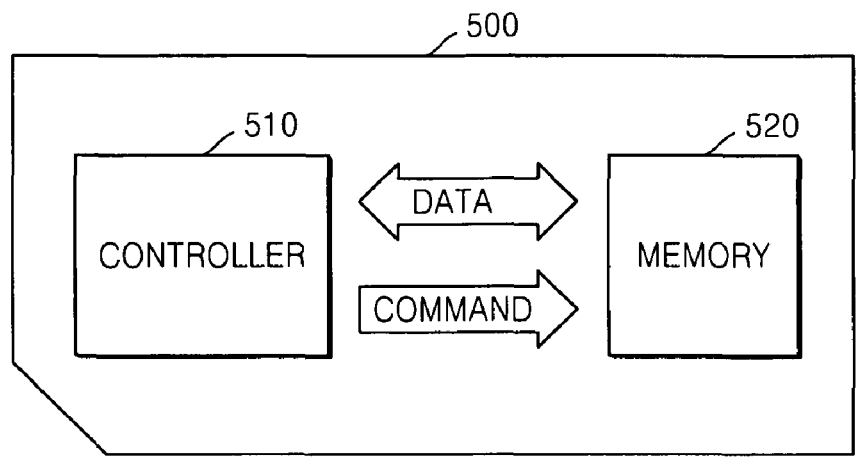

FIG. 10 is a schematic diagram illustrating a memory card 500 according to example embodiments of the inventive concepts. Referring to FIG. 10, a controller 510 and a memory 520 may exchange electric signals. For example, according to commands of the controller 510, the memory 520 and the controller 510 may exchange data. Accordingly, the memory card 500 may either store data in the memory 520 or output data from the memory 520. The memory 520 may include one of the non-volatile memory devices described above in reference to FIGS. 1-9. Such a memory card 500 may be used as a storage medium for various portable electronic devices. For example, the memory card 500 may be a multimedia card (MMC) or a secure digital (SD) card.

Figure 11:
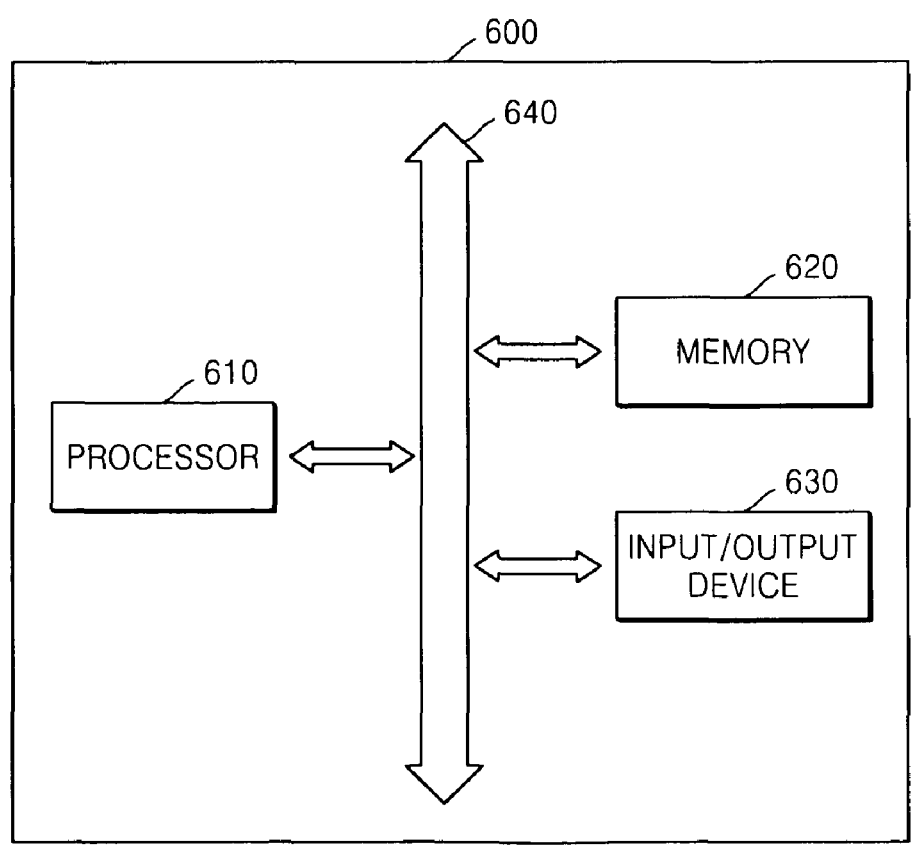

FIG. 11 is a block diagram roughly illustrating an electronic system 600 according to example embodiments. Referring to FIG. 11, a processor 610, an input/output device 630, and a memory 620 may perform data communication with each other by using a bus 640. The processor 610 may execute a program and control the electronic system 600. The input/output device 630 may be used to input/output data to/from the electronic system 600. The electronic system 600 may be connected to an external device, e.g. a personal computer or a network, by using the input/output device 630 and may exchange data with the external device.

The memory 620 may store codes or programs for operations of the processor 610. For example, the memory 620 may include one of the non-volatile memory devices described above in reference to FIGS. 1-9. For example, such an electronic system 600 may embody various electronic control systems requiring the memory 620, and, for example, may be used in mobile phones, MP3 players, navigation devices, solid state disks (SSD), or household appliances.

While example embodiments have been particularly shown and described, it will be understood by one of ordinary skill in the art that variations in form and detail may be made therein without departing from the spirit and scope of the claims.

What is claimed is:

1. A multi-bit phase change memory device, comprising:
   a phase change material including at least one of a binary and ternary compound, the at least one compound configured to switch between at least three different crystalline states,
   wherein the phase change material is part of a storage node, and each of the crystalline states has a different resistance value,
   wherein the crystalline state of the at least one compound is switched based on a temperature applied to the phase change material, and in each of the crystalline states the at least one compound includes a crystalline phase of a different combination of elements of the at least one compound, and
   wherein the at least one compound is configured to switch to at least one of the crystalline states according to a eutectoid reaction, and the at least one compound is configured to switch to a different one of the crystalline states according to a peritectic reaction.

2. The multi-bit phase change memory device of claim 1, wherein the storage node is configured apply one of at least four pulses to change the crystalline state of the compound, a shape of the pulse determining the crystalline state.

3. The multi-bit phase change memory device of claim 1, wherein the phase change material includes a chalcogen represented by $M_a(In_xTe_{1-x})_b$,
   M is at least one of silver (Ag), germanium (Ge), bismuth (Bi), antimony (Sb), and silicon (Si),
   about $0.35 \leq x \leq$ about 0.65, and
   a+b=about 1.

4. The multi-bit phase change memory device of claim 3, wherein $0 < a \leq s$ about 0.3.

5. The multi-bit phase change memory device of claim 1, wherein the phase change material further includes at least one of carbon (C), nitrogen (N) and oxygen (O).

6. The multi-bit phase change memory device of claim 1, wherein the phase change material includes a chalcogen compound represented by $A_aM_b(In_xTe_{1-x})_c$, A is at least one of carbon (C), nitrogen (N), and oxygen (O), M is at least one of silver (Ag), germanium (Ge), bismuth (Bi), antimony (Sb), and silicon (Si), about $0.4 \leq x \leq$ about 0.6, a+b+c=about 1, $0 < a \leq$ about 0.1, and $0 < b \leq$ about 0.3.

7. The multi-bit phase change memory device of claim 1, wherein the composition includes about 66.6 mole % of InTe.

8. The multi-bit phase change memory device of claim 1, wherein the multi-bit phase change memory device is configured to record data in a reset phase by applying an electrical pulse to the phase change material, the electrical pulse configured to melt and cool at least a portion of the phase change material into an amorphous phase, the multi-bit phase change memory device is configured to record data in a set phase by applying one of three electrical pulses to the phase change material, each of the electrical pulses configured to heat and cool at least a portion of the phase change material into one of three different crystalline phases, and the multi-bit phase change memory device is configured to read the recorded data by determining a resistance difference between a resistance of the phase change material in the amorphous phase and a resistance of the phase change material.

9. The multi-bit phase change memory device of claim 1, wherein the crystalline states correspond to crystalline phases of the at least one compound, and crystallization temperatures of the crystalline phases are in a range of about 200° C. to about 600° C.

10. The multi-bit phase change memory device of claim 1, wherein the storage node further includes first and second electrode layers on the phase change material, at least one of the first and second electrode layers coupled to a word line, and the other of the first and second electrode layers coupled to a bit line.

11. An electronic system comprising the multi-bit phase change memory device of claim 1.

12. A nonvolatile memory device, comprising:

a first electrode layer;

a phase change material layer on the first electrode layer, the phase change material layer configured to switch between at least 4 resistance states, the resistance states including an InSb crystal state, an $In_3Sb_1Te_2$ crystal state, an InTe crystal state and an amorphous state;

a heating member on the phase change material layer; and a second electrode on the heating member, wherein resistance ratios of the $In_3Sb_1Te_2$ crystal state to the amorphous state and the InTe crystal state to the amorphous state are greater than about 70.

13. The nonvolatile memory device of claim 12, wherein the non-volatile memory device is configured to change the resistance state of the phase change material layer based on one of four applied electrical pulses, a shape of the applied electrical pulses configured to determine the resistance state of the phase change material.

14. A phase change material layer, comprising:

a ternary compound having pseudo-binary behavior characteristics, the ternary compound configured to reversibly change between a plurality of different crystalline phases and at least one amorphous phase, the phase of the ternary compound determined according to applied energy, wherein the phase change material includes a chalcogen represented by $M_a(In_xTe_{1-x})_b$, M is at least one of silver (Ag), germanium (Ge), bismuth (Bi), antimony (Sb), and silicon (Si), about $0.35 \leq x \leq$ about 0.65, and a+b=about 1.

15. A memory card comprising the multi-bit phase change memory device of claim 1.

16. A phase change material layer, comprising:

a ternary compound having pseudo-binary behavior characteristics, the ternary compound configured to reversibly change between a plurality of different crystalline phases and at least one amorphous phase, the phase of the ternary compound determined according to applied energy, wherein the phase change material includes a chalcogen compound represented by $A_aM_b(In_xTe_{1-x})_c$, A is at least one of carbon (C), nitrogen (N), and oxygen (O), M is at least one of silver (Ag), germanium (Ge), bismuth (Bi), antimony (Sb), and silicon (Si), about $0.4 \leq x \leq$ about 0.6, a+b+c=about 1, $0 < a \leq$ about 0.1, and $0 < b \leq$ about 0.3.

* * * * *